(12) United States Patent
Lang et al.

(10) Patent No.: US 8,778,781 B2
(45) Date of Patent: Jul. 15, 2014

(54) METHOD OF GROWING A THIN FILM, A METHOD OF FORMING A STRUCTURE AND A DEVICE

(75) Inventors: Christian Lang, Oxford (GB); Ying Jun James Huang, Oxford (GB); Thomas Heinz-Helmut Altebaeumer, Oxford (GB); Stephen Day, Oxford (GB); Jonathan Heffernan, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 631 days.

(21) Appl. No.: 13/054,975

(22) PCT Filed: Jul. 24, 2009

(86) PCT No.: PCT/JP2009/063620
§ 371 (c)(1),
(2), (4) Date: Mar. 4, 2011

(87) PCT Pub. No.: WO2010/010972
PCT Pub. Date: Jan. 28, 2010

(65) Prior Publication Data
US 2011/0139209 A1    Jun. 16, 2011

(30) Foreign Application Priority Data
Jul. 24, 2008  (GB) .................................. 0813565.3

(51) Int. Cl.
*H01L 21/20* (2006.01)
*H01L 23/48* (2006.01)

(52) U.S. Cl.
USPC ...................... 438/478; 257/734; 257/E29.09

(58) Field of Classification Search
USPC ................................................... 257/E21.09
See application file for complete search history.

(56) References Cited

U.S. PATENT DOCUMENTS

| 5,800,617 A | 9/1998 | Sandhu |
| 6,500,747 B1 | 12/2002 | Lee et al. |

(Continued)

FOREIGN PATENT DOCUMENTS

| EP | 0 724 286 A1 | 7/1996 |
| EP | 1 892 768 A2 | 2/2008 |

(Continued)

OTHER PUBLICATIONS

Supplementary European Search Report for corresponding European Application No. 09800482.3 dated Dec. 7, 2012.

(Continued)

*Primary Examiner* — Julio J Maldonado
*Assistant Examiner* — Joseph Galvin, III
(74) *Attorney, Agent, or Firm* — Renner, Otto, Boisselle & Sklar, LLP

(57) ABSTRACT

A method of growing a thin film comprises growing a thin film by conformally forming at least one layer over a substrate having structures extending from a surface of the substrate, whereby the or each layer is formed over the surface of the substrate and over the structures extending from the surface. The thickness of the conformal layer, or the sum of the thicknesses of the conformal layers, is at least half the average spacing of the structures, and; at least one of the height of the structures, the average spacing of the structures and the size of the smallest dimension of the structures is set so as to provide an enhanced growth rate for the or each conformal layer (compared to the growth rate over a planar substrate).

66 Claims, 14 Drawing Sheets

(56) References Cited

U.S. PATENT DOCUMENTS

| | | |
|---|---|---|
| 6,946,597 B2 | 9/2005 | Sager et al. |
| 2004/0118698 A1 | 6/2004 | Lu et al. |
| 2005/0098205 A1 | 5/2005 | Roscheisen et al. |
| 2005/0136564 A1 | 6/2005 | Oh et al. |
| 2006/0207647 A1 | 9/2006 | Tsakalakos et al. |
| 2007/0111368 A1 | 5/2007 | Zhang et al. |
| 2008/0009401 A1 | 1/2008 | Cornay et al. |
| 2008/0047604 A1 | 2/2008 | Korevaar et al. |
| 2008/0090401 A1 | 4/2008 | Bratkovski et al. |
| 2008/0110486 A1* | 5/2008 | Tsakalakos et al. .......... 136/244 |
| 2009/0121709 A1* | 5/2009 | Gazit et al. ............... 324/207.13 |
| 2009/0149344 A1* | 6/2009 | Zhao et al. ...................... 506/12 |

FOREIGN PATENT DOCUMENTS

| | | |
|---|---|---|
| EP | 1 892 769 A2 | 2/2008 |
| EP | 1 923 918 A2 | 5/2008 |
| EP | 1 944 812 A2 | 7/2008 |
| JP | 2008-53730 A | 3/2008 |
| JP | 2008-53731 A | 3/2008 |
| JP | 2008-135740 A | 6/2008 |
| WO | 2004/044948 A2 | 5/2004 |

OTHER PUBLICATIONS

International Search Report for corresponding International Application No. PCT/JP2009/063620 mailed Oct. 27, 2009.

Form PCT/ISA/237 for corresponding International Application No. PCT/JP2009/063620 mailed Oct. 27, 2009.

UK Search Report for corresponding UK Application No. GB0813568.3 dated Nov. 24, 2008.

Könenkamp et al., "Thin film semiconductor deposition on free-standing ZnO columns", Applied Physics Letters, vol. 77, No. 16, Oct. 16, 2000, pp. 2575-2577.

Hadobás et al., "Reflection properties of nanostructure-arrayed silicon surfaces", Nanotechnology, 11 (2000), pp. 161-164.

Stavenga et al., "Light on the moth-eye corneal nipple array of butterflies", Proceedings of the Royal Society, Proc.R.Soc. B, (2006), 273, pp. 661-667.

* cited by examiner

Thickness of the deposited film

| | |
|---|---|
| ■ | Electrodes 5a, 9 |
| ▨ | Active device layers 5b |

FIG. 13(a)
Square Lattice
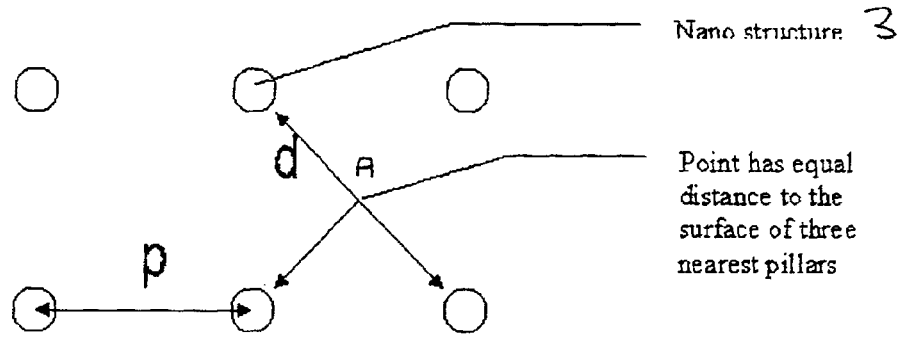
Triangular Lattice
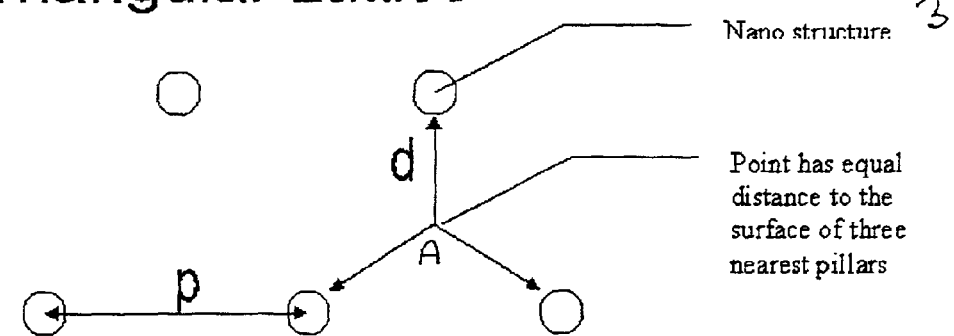
FIG. 13(b)

Parallelogram Lattice

Plane structure

METHOD OF GROWING A THIN FILM, A METHOD OF FORMING A STRUCTURE AND A DEVICE

TECHNICAL FIELD

The present invention relates to the growth of a thin film on a substrate. In particular it relates to enhancing the growth rate of a thin film (compared to growth over a planar substrate) by conformal deposition on a structured substrate.

BACKGROUND ART

The growth of thin films is a core process in the production of many electronic and optoelectronic devices. It is also often the most costly and time consuming step and any increase in the efficiency of thin film deposition would almost certainly lead to a reduction of the production costs.

Thin films are deposited onto a substrate material which carries them. Substrates can be made up of virtually any solid material. One of the main criteria for a substrate is that it has to withstand the process conditions during the thin film deposition and subsequent processing, especially with respect to the temperature.

Thin films can be deposited in a variety of ways including chemical vapour deposition (CVD), molecular beam epitaxy (MBE), Vapour Phase Epitaxy (VPE), Atomic Layer Deposition (ALD), sputtering, electro-deposition, thermal evaporation etc. This is by no means an exhaustive list and new techniques for thin film deposition are constantly being developed. For the purpose of this patent, these techniques are split into two categories: directional and conformal techniques. In directional techniques the mean free path of the particles deposited is larger than the distance between the source of the material and the substrate (e.g. sputtering, thermal evaporation, MBE). This means that deposition on some parts of the substrate can be limited, e.g. by putting obstacle into the path between the source and the substrate surface or by structuring surface structure itself (i.e. no film will be deposited onto parts of the surface which are parallel to the path between the source and the substrate.

In conformal techniques the thin film is deposited everywhere on the substrate surface. The mean free path is shorter than the distance between the source and the substrate. In fact, the path a particle takes can often be described by Brownian Motion.

For many techniques the process conditions can be varied so that the deposition is either conformal, directional or somewhere in-between.

SUMMARY OF INVENTION

For the purpose of this patent, growth is defined as the process of filling a volume. Deposition is defined as the process of coating a surface. In most technical applications, the deposition rate remains uniform across a planar surface and is therefore identical with the growth rate. In these cases the terms deposition and growth may be used interchangeably.

Often, the composition of a thin film is varied during the growth by using different source materials. This means that thin films can be deposited as alloys or, in many cases, can be doped by using dopant gases.

There are numerous examples of devices in the production of which thin film growth is an essential part. A few examples are CMOS structures, magnetic structures for hard disc drives, thin film solar cells, solid state LEDs and lasers, RF devices in mobile phones, photodetectors in digital cameras.

The demands on thin film morphology, materials quality, materials purity and control over growth process depend on the technical and economical requirements of the application. Hence, they vary greatly, are very specific and highly optimised.

Some of the parameters that can be optimised are growth temperature, the gas flow, partial pressures of different process gases and the concentration of precursor gases. Progress in the scientific field of thin film growth often consists of new optimisation of one or more of these parameters or in the invention of new deposition equipment. More recently, improvements of thin film growth were achieved through changes in the properties of the substrate. Strain induced by a lattice mismatch between the substrate materials and the thin film materials has been used to change the structure or properties of the thin film. One example of this is the growth of silicon thin films on $SiO_2$ substrates with the aim to engineer the electronic properties of the film.

Another example is the growth of a thin film sandwiched between two other thin films to achieve quantum confinement (quantum wells). Strain between the substrate and a deposited thin film can also lead to the relaxation of the deposited film which either results in the creation of defects (dislocations, voids) or 3D structures (quantum dots). Another way to modify the substrate to induce a change of the growth morphology is the deposition of a catalyst on the surface. This has been used recently to induce one-dimensional growth (e.g. nanowires).

In contrast, this patent describes a method to improve thin film growth by changing the morphology of the substrate with the aim to enhance the thin film growth rate. In particular, the method is applicable to deposition methods which are at least to some degree conformal.

Definition of Terms

LPCVD: Low-pressure chemical vapour deposition
PECVD: Plasma enhanced chemical vapour deposition
MBE: Molecular beam expitaxy
Deposition: The process of coating a substrate
Growth: The process of filling a volume
Deposition rate: The thickness of the material layer deposited per unit time measured in the direction of the surface normal
Growth rate: The volume filled by the material per unit time
Substrate: The body on which the first layer of the thin film is deposited
Thin film: A thin film is a material layer with a thickness ranging from 1 atomic layer to several micrometers.
Regular thin film: A thin film deposited onto the surface of a flat substrate so that each layer of the film is parallel to the original substrate surface
Low dimensional, nanoscale structure: A structure with at least one of the horizontal dimensions smaller than the vertical dimension (by a ratio of at least 2:1) and with at least one of the horizontal dimensions smaller than 1 micrometers and preferably less than 100 nm (a subset of such structures are also described in this patent as a "pillar")

It is important to note that the surface on which material is deposited changes during the deposition process (e.g. its distance from the substrate surface).

Additive (e.g. deposition, transfer):
1. Deposition methods include but are not restricted to direct or indirect thermal evaporation, sputter deposition, chemical vapour deposition, spin coating, and ink-jet printing
2. Transfer methods include dry transfer methods such as stamp-based transfers, and device bonding as well as wet transfer methods where the transfer of the desired structures occurs out of solution Subtractive (e.g. etching, sputtering, dissolving):
1. Etching includes wet-chemical etching and dry etching (e.g. reactive ion etching). Dry etching techniques may be combined with sputtering techniques.
2. Sputtering includes ion milling.

ACKNOWLEDGEMENT OF THE PRIOR ART

Low dimensional, elongate structures are often termed nanowires or nanorods, depending on their aspect ratio. Nanowires can be made of a wide range of materials and are most commonly grown on a solid substrate while taking advantage of the catalytic properties of suitable metals which, when process gases are supplied, induce preferential 1D growth. Growth conditions and substrates can be chosen such that the growth direction of the nanowire or nanorod is essentially vertical to the substrate surface, although on non-crystalline substrates achieving one preferred and well controlled growth direction remains an unsolved challenge.

One reason why this kind of nanowire growth is difficult to use in an industrial process lies in the need of a catalyst, which tends to leave metal impurities in the wire which are usually detrimental to the desired device performance.

Methods are known to deposit thin films onto substrate materials. Also thin films have been deposited around nanoscale, low-dimensional structures. However, none of these methods fulfils all of the following requirements simultaneously:

1) To provide the low level of impurities which is necessary to obtain high quality, high performing semiconductor devices like CMOS transistors and inorganic solar cells;
2) To grow at a rate exceeding the rate expected from planar thin film growth on a planar substrate at the same deposition rate;
3) To make more efficient use of the process gases compared to horizontal thin film growth at the same deposition rate;
4) To introduce a controlled degree of roughness of the top surface;
5) To offer a method forming an interlaced device without requiring any specific nanowire growth steps;
6) To offer precise control to configure the interlaced device structure.

US2007/0111368 A1 discloses a structure consisting of a conductive nanowire electrode on a conductive substrate with a solar cell structure deposited around it. This is achieved by growing conductive nanowires on either the top or the bottom electrode. The patent does not mention specific values for the height, diameter and pitch of the wires.

US2006/0207647 A1 discloses a photovoltaic device comprising a structure consisting of an array of vertical structures forming a charge separating junction with a second region residing on top of a first structure and a third region made of a transparent conductor residing on top of the second region. There is a charge separating junction between the nanostructures in the first region and the second region.

US 2008/0090401 A1 discloses an apparatus comprising a first set of nanowires and a second set of nanowires interdigitated with the first set of nanowires, wherein the first set of nanowires is independently addressable and electrically isolated from the second set of nanowires. Both sets of nanowires are grown using conventional nanowire growth techniques.

Koenenkamp et al., APL 77, 2575 (2000) disclose a structure consisting of ZnO nanowires, grown on a glass substrate. The ZnO nanowires are of random orientation. A p-i-n solar cell structure is deposited onto the nanowires. They aimed to take advantage of the additional surface provided by the nanowires to increase the overall surface area of the solar cell. To achieve this, merging of adjacent nanowires had to be minimised as much as possible, leaving a large amount of the volume between the nanowires void.

U.S. Pat. No. 6,946,597 B2 discloses a method of fabricating an organic solar cell device comprising two interdigitated conducting layers, wherein one layer is provided by a porous template, structured by mask-less anodizing of a metal surface, and where a second layer is formed by taking advantage of the topography of said anodized metal. The anodisation is constrained to a limited set of suitable metals. Furthermore, the method disclosed does not enable the fabrication of a template comprising an array of pores with well defined dimensions (e.g. variations of pitch and diameter of less than 10%). Also, the use of metal-based templates potentially restricts the time-temperature budget of subsequent process steps due to the risk of metal contamination. This may not impose concerns regarding the fabrication of organic solar cells, but its compatibility with the process steps required to fabricate inorganic solar cells (e.g. Si-based solar cells) is questionable. It is not disclosed that the dimensions of the porous template can be optimised to increase the growth rate of conformal deposition techniques, as no suitable conformal deposition techniques are available to form polymer films.

The key material properties to be considered when designing the topographical dimensions of the template are the absorption depth and the carrier diffusion length. These are in those inorganic materials which are commonly used in solar cells much shorter than in inorganic (semiconducting) materials, requiring in the latter much thicker films. Hence, the dimensions disclosed (e.g. a pitch of the pores below 500 nm) may too small to accommodate all of the material required to form an efficient inorganic solar cell—especially if additional layers such as diffusion barriers, electrical contacts and anti-reflection coatings need to be accommodated.

SUMMARY OF THE INVENTION

A first aspect of the present invention provides a method of growing a thin film, the method comprising:
  growing a thin film by conformally forming at least one layer over a substrate having structures extending from a surface of the substrate, whereby the or each layer is formed over the surface of the substrate and over the structures extending from the surface;
  wherein the thickness of the conformal layer, or the sum of the thicknesses of the conformal layers, is at least half the average spacing of the structures;
  and wherein at least one of the height of the structures, the average spacing of the structures and the size of the smallest dimension of the structures (for example, the smallest dimension of the structures is the diameter if the structures are pillars, and is the thickness if they are planar structures) is set so as to provide an enhanced growth rate for the or each conformal layer.

By the term "enhanced growth rate" is meant a growth rate that is at least twice the growth rate that would be obtained on a planar growth surface, using the same growth method and the same growth conditions.

It should be noted that specifying that the structures are "extending from a surface of the substrate" does not require that "surface" was the original surface of the substrate over which the structures have been deposited by an additive process. In principle, the structures may be defined using a subtractive process (and, as explained below, use of a subtractive process to form the structures may be preferable).

It should be noted that references to the "height" of the structures do not mean that the invention is limited to the specific orientation shown in the figures, namely with the structures extending generally vertically upwards from the substrate. The term "height" denotes generally the length of the structures. The length denotes the longest dimension not parallel to the substrate surface.

By "conformally forming" a layer is meant that the layer is formed using a deposition technique that is at least partially conformal, and a "conformal layer" similarly is a layer that was formed using a deposition technique that is at least partially conformal. In general, the degree of conformality of formation of a layer may be quantified by the parameter x which is the ratio, for a growth process, of deposition rate on a vertical surface to deposition rate on a horizontal surface. In the case of an ideal conformal formation process x=1, and for an ideal directional formation process x=0.

In general, where the description of the invention given below refers to "a conformal growth technique", this indicates that the growth technique used preferably has a degree of conformality of x≥0.5.

The average spacing, in a direction parallel to the substrate, between the structures may be less than their height.

The structures may have a uniform or substantially uniform pitch.

The structures may have a uniform or substantially uniform height.

The structures may be identical or substantially identical to one another

The height h of the structures may satisfy:

$$xh \geq d$$

where d is the minimum thickness of the thin film required to fill the volume between the structures and x is the degree of conformality (as defined above) of the formation process.

There will always be an enhancement in thin film growth rate on a non-planar substrate surface compared to growth on a planar surface. However, ensuring that the above inequality is satisfied provides at least twice the growth rate.

The structures may be elongate one-dimensional structures.

The cross-section of the structures may be approximately circular, whereby r is half the diameter of the structures.

The structures may be nanowires or nanorods.

The structures may be planar structures.

The structures may make an angle of 45° or less to the normal to a plane of the substrate.

The structures may make an angle of 20° or less to the normal to a plane of the substrate.

The structures may make an angle of 5° or less to the normal to a plane of the substrate.

The method may comprise forming the structures.

The method may comprise forming the structures by a subtractive process.

The method may comprise forming at least two conformal layers over the surface and over the structures.

The method may comprise planarising the upper surface of the thin film.

The method may comprise forming another layer over the upper surface of the thin film.

The conformal layer(s) may constitute the active region of a device.

The or each conformal layer may be a silicon layer.

The method may comprise forming at least two conformal layers having different doping types from one another over the surface and over the structures.

A second aspect of the present invention provides a method of forming a thin film structure, the method comprising: growing a thin film by conformally forming at least one layer over a substrate having a first set of structures extending from a surface of the substrate, whereby the or each layer is formed over the surface of the substrate and over the structures extending from the surface; wherein the thickness of the conformal layer, or the sum of the thicknesses of the conformal layers, is less than the thickness d, where d is the minimum thickness of the thin film that is required to fill the volume between the nano structures completely whereby the conformal layer(s) do not fill the volume between the neighbouring ones of the structures; and wherein the method further comprises depositing one or more further layers in the volume unoccupied by the conformal layer(s) thereby to obtain a second set of structures interlaced with the first set of structures.

A third aspect of the present invention provides a thin film formed by a method of the first aspect.

A fourth aspect of the present invention provides a device comprising a thin film formed by a method of the first aspect.

A fifth aspect of the present invention provides a structure formed by a method of the second aspect.

A sixth aspect of the invention provides a device comprising: a substrate; an array of structures extending from a surface of the substrate; and one or more thin films deposited by an at least partially conformal technique over the surface and over the structures; wherein the height h of the structures and the width of the structures in a direction parallel to the surface satisfy:

$$xh \geq d$$

where d is the minimum thickness of the thin film required to fill the volume between the structures and x is the degree of conformality (as defined above) of the formation process.

A seventh aspect of the present invention provides a device comprising: a substrate; an array of structures extending from a surface of the substrate; a thin film comprising one or more layers conformally deposited over the surface and over the structures, wherein the thickness of the conformal layer, or the sum of the thicknesses of the conformal layers, is less than the minimum thickness (d) of the thin film that is required to fill the volume between the structures completely; and one or more further layers deposited in the volume unoccupied by the conformal layer(s) so as to provide a second array of structures interlaced with the first set of structures.

The structures may be electrically insulating.

The device may comprise an array of lenses or antireflection structures defined on another surface of the substrate.

The structures may comprise a transparent material. By transparent material is meant a material that is transparent or substantially transparent over a desired wavelength range such as, for example, the visible wavelength range.

The structures of the array may be integral with the substrate. This will be the case for example where the structures are formed by a subtractive process performed on the substrate.

The thin film may comprise a first electrode layer. As part of the thin film, the first electrode layer will generally follow the topology defined by the structures and the surface of the substrate.

The one or more further layer may comprise a second electrode layer. As the further layer(s) are disposed in the volume(s) unoccupied by the thin film, the second electrode layer may also generally follow the topology defined by the structures, the surface of the substrate and any previously formed layers. This makes it possible for the second electrode layer to be interdigitated with the first electrode layer, if this is desired.

The device may comprise a photovoltaic device.

Low dimensional nanoscale structures or other elongate structures protruding off a substrate surface are formed. According to the invention a film (which may comprise one or more layers) is then deposited with some degree of conformality around the structures and onto the substrate until the volume between the structures is filled. The size of the smallest dimension and pitch of the structures as well as the deposition rate determine the time that is required to grow the film, while their height ultimately determines the final thickness of the film, thereby essentially decoupling the growth time from the deposition rate determined by the chosen process. In other words, the increase in the growth rate is due to the reduction in the effective film thickness required to fill the volume between the structures, which is approximately equal to half the pitch of the structures (assuming that the smallest dimension of the structures is significantly smaller than their pitch).

More precisely, the effective film thickness required to fill the volume between the structures, is equal to half the spacing of the structures. As used herein, the "pitch" refers to the distance between the centre of one structure and the centre of a neighbouring structure, and the "spacing" refers to the distance between the exterior surface of one structure and the exterior surface of a neighbouring structure. The "spacing" between two structures is found by subtracting the radius of each structure from the pitch of the structures. As noted above, the "spacing" between two structures is approximately equal to their "pitch" in the case where the smallest dimension of the structures is significantly smaller than their pitch.

It may be important to minimise the volume occupied by the structures by optimising their smallest dimension and pitch. To achieve this it is usually desirable to minimise the size of the smallest dimension of the low-dimensional elongate structures while still ensuring that the equation xh≥d is satisfied.

As noted the film contains one or more layers which follow conformably the surface contour provided by the substrate and the elongate low-dimensional structures. Where the film contains two or more layers, these may differ from one other by one or more properties (e.g. materials, doping, conductivity, reflectivity, permeability, etc). The space between the structures can be filled with one or more conformal layers or non-conformal layers or partially conformal layers or combination of these in any order, provided that at least one layer is conformal or partially conformal to achieve an enhanced growth rate. For example, there could be one conformal layer and one non-conformal layer filling the space between the structures.

The structures may be formed in any suitable way. It is however preferable that the structures on the substrate have a well-defined size of their smallest dimension, orientation, height and pitch and have a well defined contact angle between the structure and the substrate. The thickness of the film is determined by the spacing between structures and their height, so that variations in the spacing between structures or their height may well lead to variations in the film thickness.

The structures themselves are neither part of the active area of the film (e.g. the active area of the solar cell structure) nor act as electrical contacts.

The first technical advantage over planar thin film growth is the obtainable increase in the growth rate (compared to the growth rate for a planar film). Using this method, the growth rate describing the increase in volume of the deposited material is not only controlled by the deposition rate but also by the height and pitch of the nanostructures. Assuming that the nanostructures are cylindrical pillars of regular diameter (2r), pitch (p), height (h) and the material is grown fully conformally, at a constant deposition rate (D), the growth rate (G) is given by:

$$G = D + \frac{\pi D}{p^2}(r^2 + 2hDt + 2hr - D^2t^2)$$

$$\text{where } 0 \le t \le \min\left(\frac{p/2 - r}{D}, \frac{h}{D}\right)$$

As $G_{thin}=D$, and $G_{nanostructure}>D$, therefore $G_{nanostructure}>G_{thin}$ at any time.

Similar relationships can be found for non-cylindrical high aspect ratio structures (e.g. fins).

The fact that this increase in the growth rate does not require a higher flux of precursor gases results in a second technical advantage by allowing a more resourceful use of the process gases. The reduction in the amount of process gases used is inversely proportional to the increase in the growth rate. If, for example, the growth rate is increased by a factor of ten by varying only the pitch and height of the nanostructure, only about ten percent of the process gases are used compared to regular thin film growth.

FIG. 1 shows the factor by which the growth rate is expected to increase as a function of the nanostructure pitch for a given nanostructure height and diameter assuming a two dimensional structure. For desired film thicknesses of a few microns and a structure pitch of several hundreds of nanometers, the increase in the growth rate can be substantial.

Through the regularity and pitch of the nanostructures as well as their height compared to the final film thickness, the surface roughness of the final top surface can be controlled. For some applications, it may be required to planarise the upper surface of the film once it has been deposited, using suitable polishing techniques, for example to provide a planar surface for deposition of further layers of a device structure. In other cases a rough surface can be desirable to couple more light into the active region of a photovoltaic device. The surface roughness can be tailored to particular requirements by optimising the regularity and pitch of the nanostructures as well as their height compared to the final film thickness.

A further embodiment of the invention is that the structures may act as templates for the growth of high quality materials. It is for example well known that semiconductor nanowires can be grown without defects or with a low defect density on highly mismatched substrates. Also, it is known from the scientific literature that nanowires can be used as seeds to grow epitaxially concentric layers (shells) around them which can be done without depositing material on non-crystalline surfaces (so-called selective epitaxial growth). The shell may consist of a material different to the nanowire This growth on a crystalline substrate can be coherent (defect free) at the nanowire-shell interface even if there is a lattice mismatch between the material of the shell and the material of the nanowire. This is due to the fact that the strain can relax along the outer surface of the nanowire.

In a further embodiment, the embedded nano structures within the thin film are removed. This can be achieved, for example, by removing the top parts of the thin film structure after the enhanced thin film growth process ((a) of FIG. 15) via suitable techniques (e.g. anisotropic etching, polishing etc) to leave the nano structures exposed ((b) of FIG. 15).

These nano structures are then removed by suitable methods (e.g. etching) ((c) of FIG. 15). Material is then deposited to fill the empty volume left by the nano structures ((d) of FIG. 15). This embodiment will offer the opportunity not only to accelerate the thin film growth rate, but also to grow a better quality thin film (i.e. fewer defects) without containing materials that are not a part of thin film (i.e. the original nano structures).

The foregoing and other objectives, features, and advantages of the invention will be more readily understood upon consideration of the following detailed description of the invention, taken in conjunction with the accompanying drawings.

BRIEF DESCRIPTION OF DRAWINGS

Preferred embodiments of the present invention will be described by way of illustrative example with reference to the accompanying figures in which:

FIGS. 13(a) to 13(d) are schematic plan views illustrating the minimum thin film thickness required to fill the volume between the structures for four different arrangements of the structures;

DESCRIPTION OF EMBODIMENTS

Figure 1:
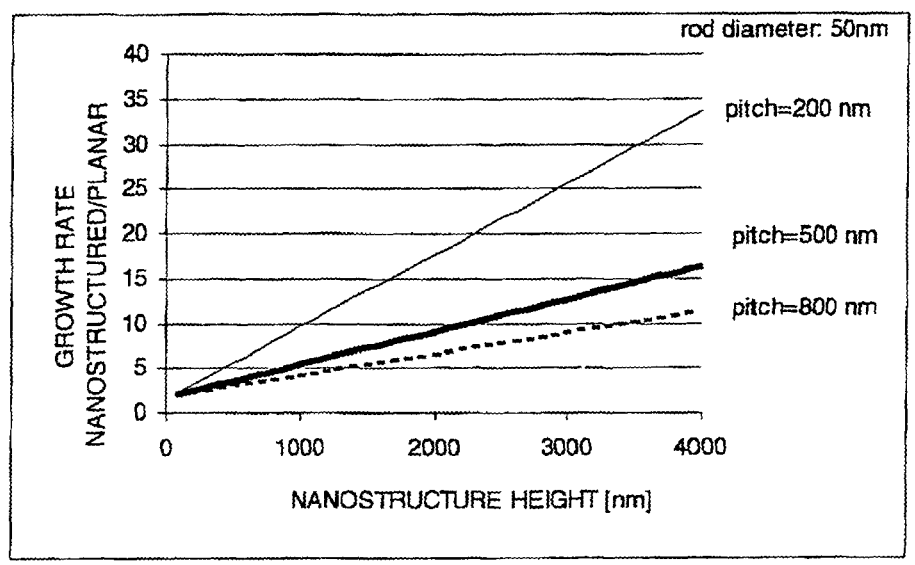
FIG. 1 shows the factor by which the growth rate increases (at the point when the structures merge) as a function of the pitch for a given radius, and height of the structures assuming two-dimensional structures.
Figure 2:
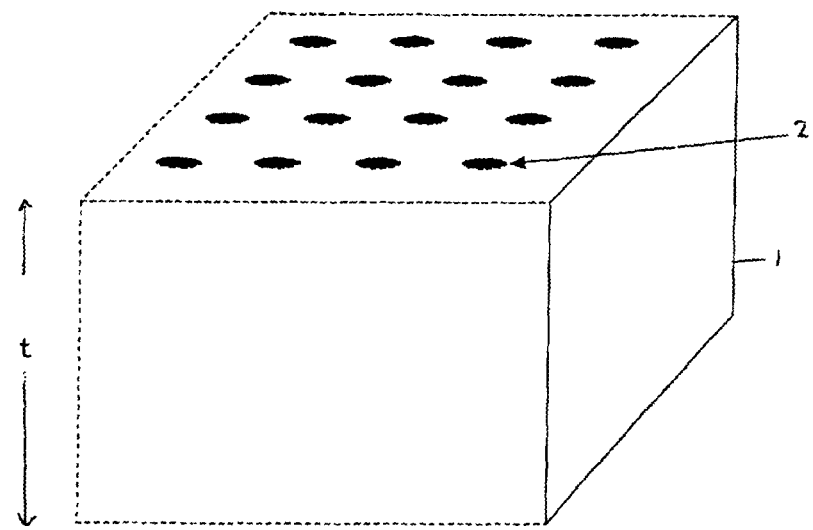
FIG. 2 shows a substrate with a mask defined on the surface for defining the vertical, nanoscale structures by a subsequent subtractive process.

In a preferred embodiment according to FIG. 2 a substrate 1 of thickness t with an appropriately patterned etch mask 2 is provided. The patterned etch mask 2 can be defined by lithographic means.

Figure 3A:
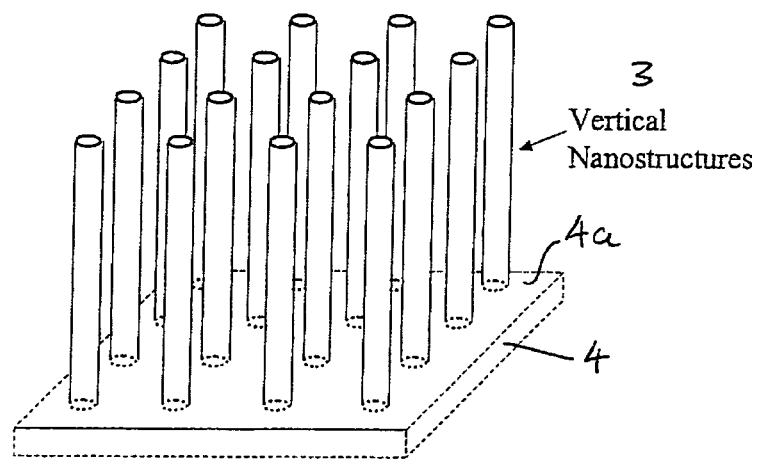
FIG. 3(a) shows the vertical, nanoscale structures obtained by etching the substrate of FIG. 2.
Figure 3B:
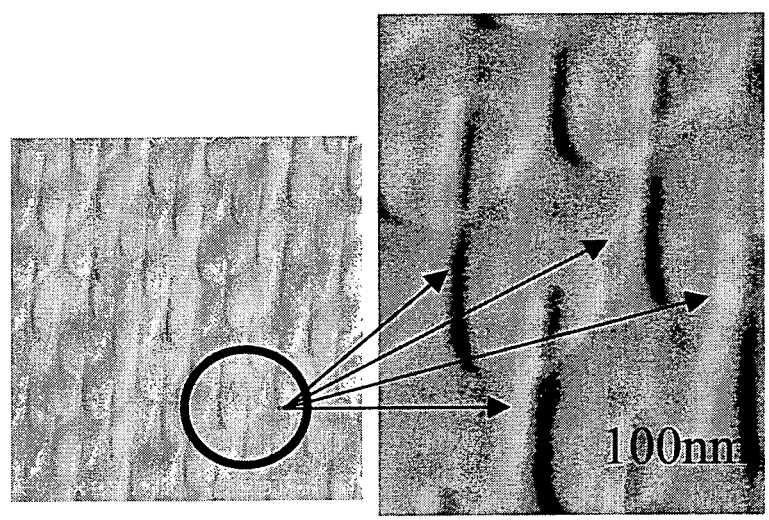
FIG. 3(b) is a micrograph showing a regular array of nanoscale structures obtained by etching.

Subsequently a substantially anisotropic, subtractive process is used to create the nanostructures 3 on substrate 4 (FIG. 3(a)). Optionally, the nanostructures 3 are formed so that they have a uniform or substantially uniform pitch and/or have a uniform or substantially uniform length. Optionally, the nanostructures 3 are formed so that the structures are identical or substantially identical to one another.

If desired, the nanostructures can be thinned further using an isotropic etch process. This may also change the shape of the structures in a preferred way (e.g. by providing a taper).

The etch mask 2 may be removed if desired, once the/all etching steps are complete.

The etch mask 2 may for example comprise a metal (e.g. Al, Au, W) or a nitride (e.g. $Si_3N_4$).

The substrate may for example comprise a transparent material (e.g. glass, quartz, polymer).

The substrate may alternatively comprise a semiconductor.

The structures 3 may extend substantially vertical off surface 4a.

The structures 3 may be electrically insulating. Electrically insulating structures can be obtained by, for example, applying a subtractive process as described above to an electrically insulating substrate 1 such as, for example, a glass or quartz substrate.

Figure 4A:
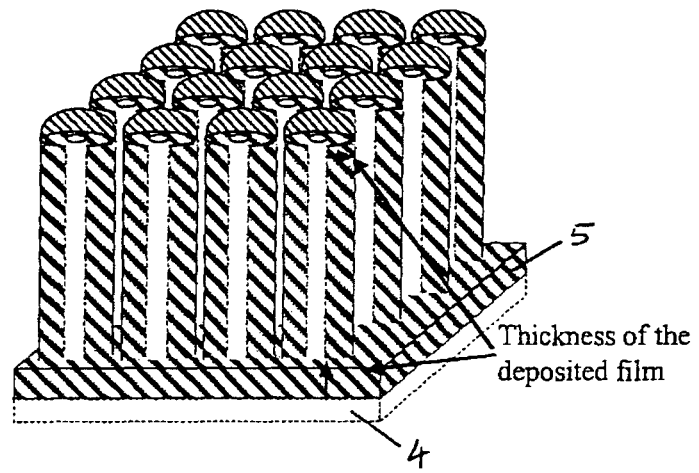
FIGS. 4(a) and 4(b) are respectively perspective and sectional views showing the vertical, nanoscale structures with material conformally deposited around them.
Figure 4B:
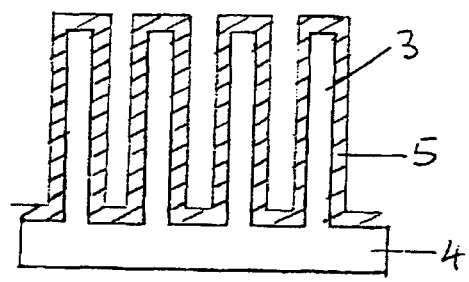
Figure 5A:
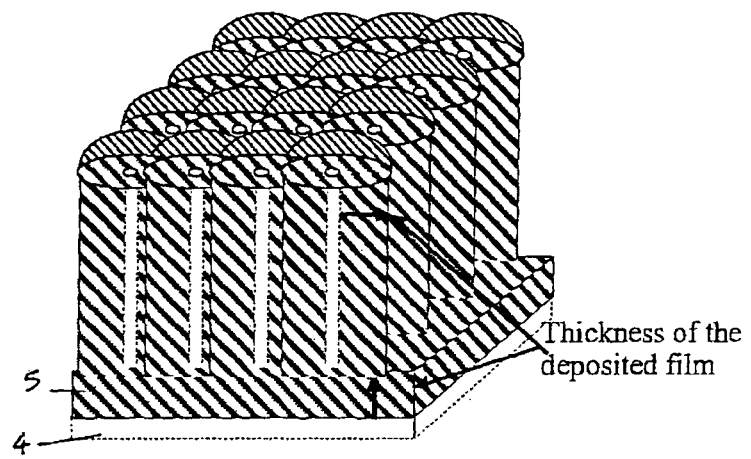
FIGS. 5(a), 5(b) and 5(c) are respectively a perspective view, a micrograph and a sectional view showing the vertical, nanoscale structures with material deposited around it so that the columns merge and form a continuous layer.
Figure 5B:
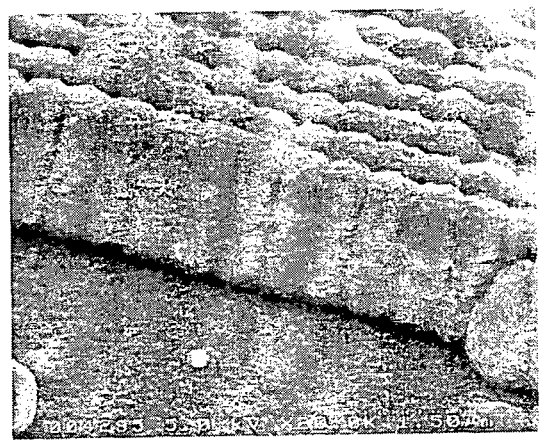
Figure 5C:
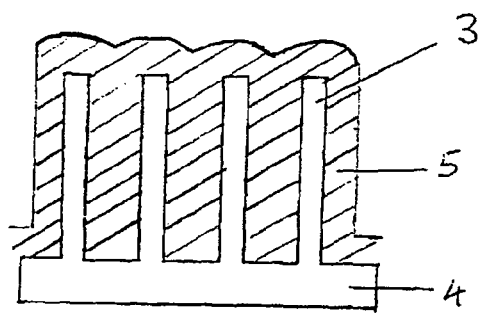

At least one layer of material is then deposited substantially conformal over the structures 3 and over the exposed portions of the surface 4a of the substrate thereby to deposit a thin film. FIGS. 4(a) and 4(b) illustrate the deposition process at a time when the thickness of material 5 deposited is less than half the spacing between adjacent structures 3. FIGS. 5(a) to 5(c) illustrate the deposition process at a later time, when the material 5 deposited on the sidewalls of nanostructures 3 completely merges, filling the volume between the structures 3.

Figure 7:
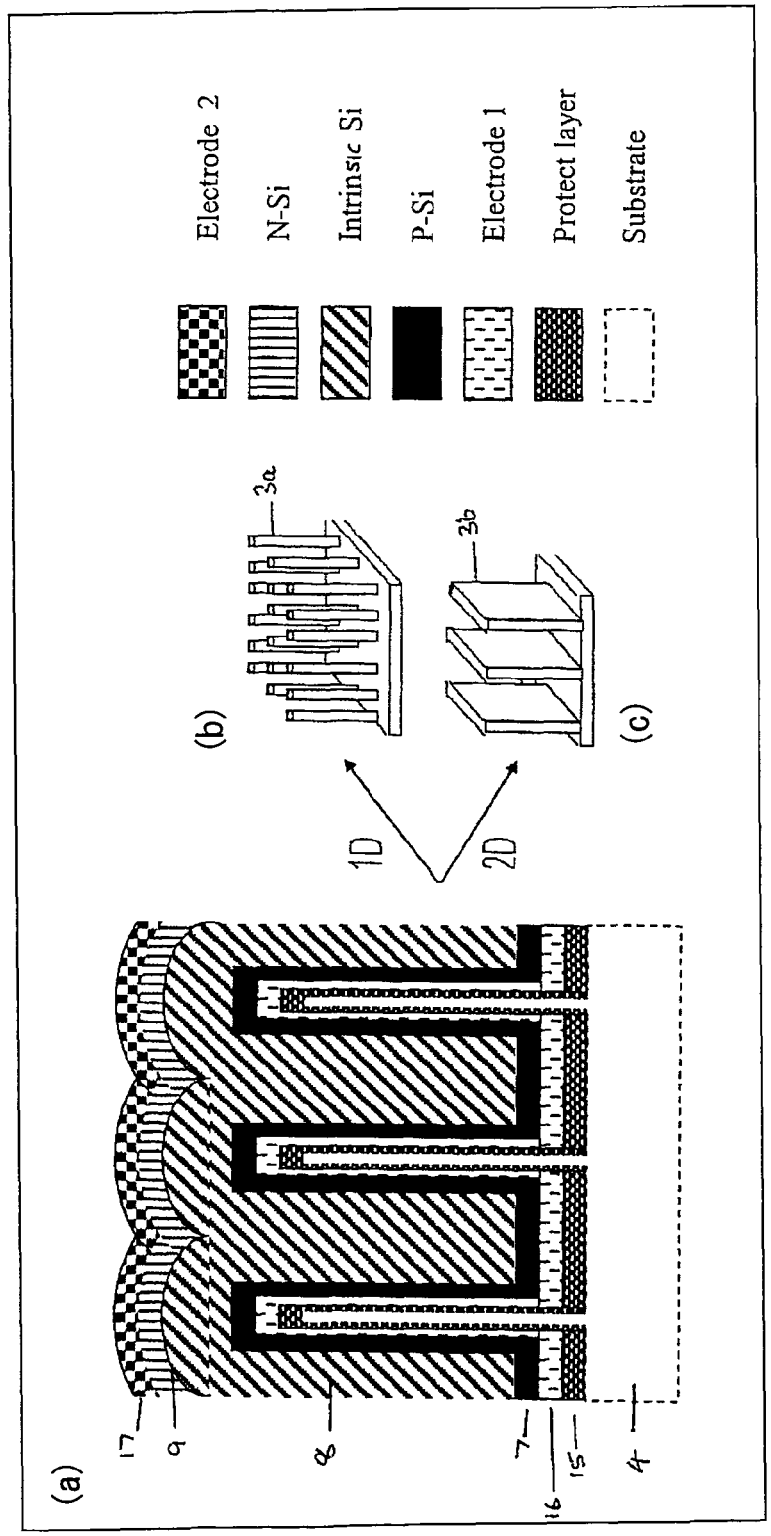
FIG. 7 shows a cross-section of the active layers of a thin film solar cell made using the vertical, nanoscale structures, whose cross-sections can either represent a 1 dimensional structure or a 2 dimensional one.

For simplicity, FIGS. 5(a) to 5(c) show deposition of a film that includes only a single layer of material 5 over the structures 3 and over the exposed portions of the surface 4a of the substrate 4. The invention is not, however, limited to this and it is possible for a film that includes two or more layers having different material compositions (e.g. dopants, doping concentrations, and other elemental compositions) to be grown in the volume defined by the structures 3 (as shown in FIG. 7, for example). Each conformal layer may be a conductive layer, a semiconductor layer (for example Si, Ge, III-V semiconductors or II-VI semiconductors) or C.

The or each layer of material deposited to form the film is preferably a homogenous layer, in that its material composition and thickness are uniform or substantially uniform over the area of the layer.

Figure 15:
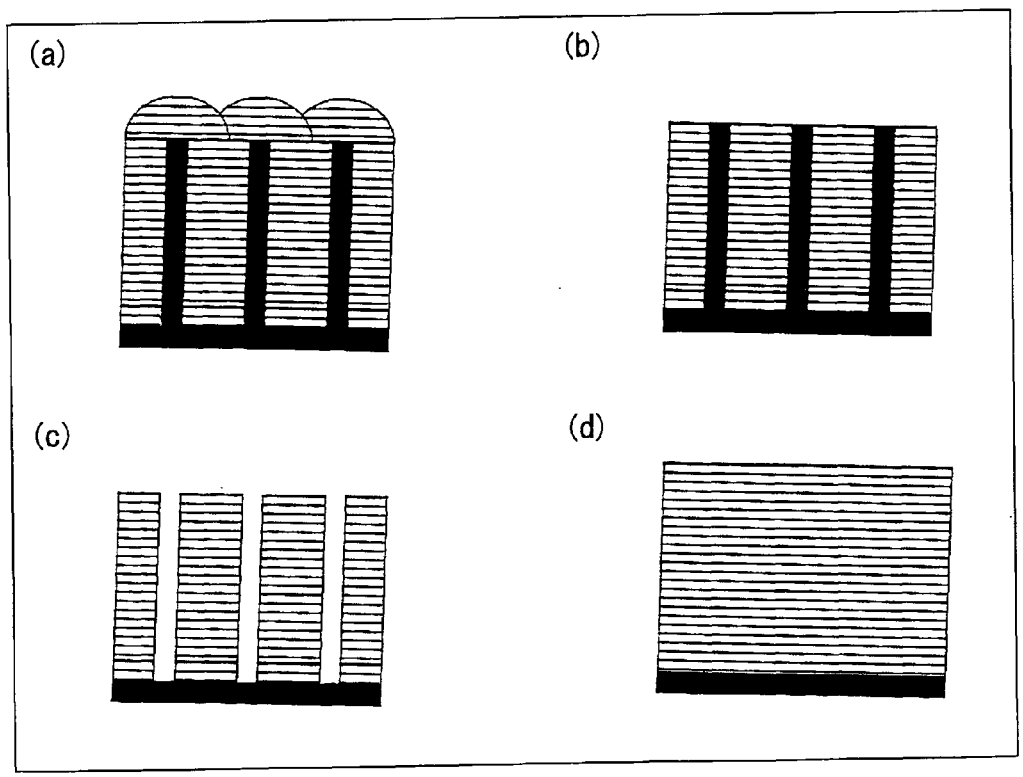
FIG. 15: (a) to (d) of FIG. 15 are schematic sectional views illustrating another embodiment of the invention.

Once the film has been deposited, further processing steps may be carried out if desired. For example, in a further embodiment, the embedded nano structures within the thin film are removed. This can be achieved, for example, by removing the top parts of the thin film structure after the enhanced thin film growth process ((a) of FIG. 15) via suitable techniques (e.g. anisotropic etching, polishing etc) to leave one or more of the nano structures exposed (b) of FIG. 15). The one or more exposed nano structures are then removed by any suitable method (e.g. etching) ((c) of FIG. 15). Material may then be deposited to fill the empty volume(s) left by the removal of the one or more of the nano structures ((d) of FIG. 15). Any desired material may be deposited to fill the empty volume(s) left by the removal of the one or more of the nano structures. For example, the material deposited to fill the empty volume(s) may have a different material composition to the nanostructures that were removed—and the material may even have the same composition as the thin film. This embodiment makes it possible not only to accelerate the thin film growth rate, but also to grow a better quality thin film (i.e. a film having fewer defects) and which does not contain materials that are not a part of thin film (i.e. which does not contain the nanostructures).

In the embodiments described above, the structures 3 present on the substrate 4 have been elongate nanostructures, in particular nanopillars. The invention is not, however, limited to this, and other forms of structures may be used. For example, as indicated in FIG. 7, the structures 3 may either be elongate, substantially one-dimensional structures 3a as shown in (b) of FIG. 7, or they may be substantially two-dimensional, planar structures 3b as shown in (c) of FIG. 7.

Where the structures 3 present on the substrate 4 are elongate nanostructures, they may have a circular cross-section or an approximately circular cross section, and may be nanowires or nanorods. However, they are not limited to having a circular cross-section.

In the Figures, the structures are shown as extending substantially perpendicular to the plane of the substrate. The invention is not, however, limited to structures that extend substantially perpendicularly from the substrate, and it may be applied with structures that are inclined with respect to the normal direction of the substrate. The structures preferably make an angle of 45° or less with the normal direction, more preferably make an angle of 20° or less with the normal direction, and particularly preferably make an angle of 5° or less with respect to the normal direction of the substrate.

A further advantage is that the use of a subtractive technique reduces constraints on the useable material classes for forming the structures, so that a wider range of materials can be used. In particular, transparent structures may easily be formed by applying a subtractive technique to a transparent (glass or quartz, for example) wafer, which may be an advantage when the invention is used in production of a solar cell or other photovoltaic structure. In particular, substrates that are not single crystal substrates such as glass may be used.

Furthermore, to obtain the full advantages of the present invention a high degree of control over the spacing of the structures 3 on the surface of the substrate is desired. Non-uniformities in any of the spacing, orientation and height of the structures can lead to a non-uniform thickness for the deposited film, and this may be undesirable in certain applications. In general, the use of a subtractive technique to form the structures 3 is likely to allow for greater control over the position, orientation and height of the structures than will an additive technique.

A structure that was not perpendicular to the substrate could be obtained, for example, by ion beam etching using an ion beam that was directed at an angle to the surface of the wafer 1 in FIG. 2, or by anisotropic dry etching where the sample surface is non-planar with respect to the top electrode of the plasma, for example either by tilting the sample or by using a sample with varying thickness.

Figure 8:
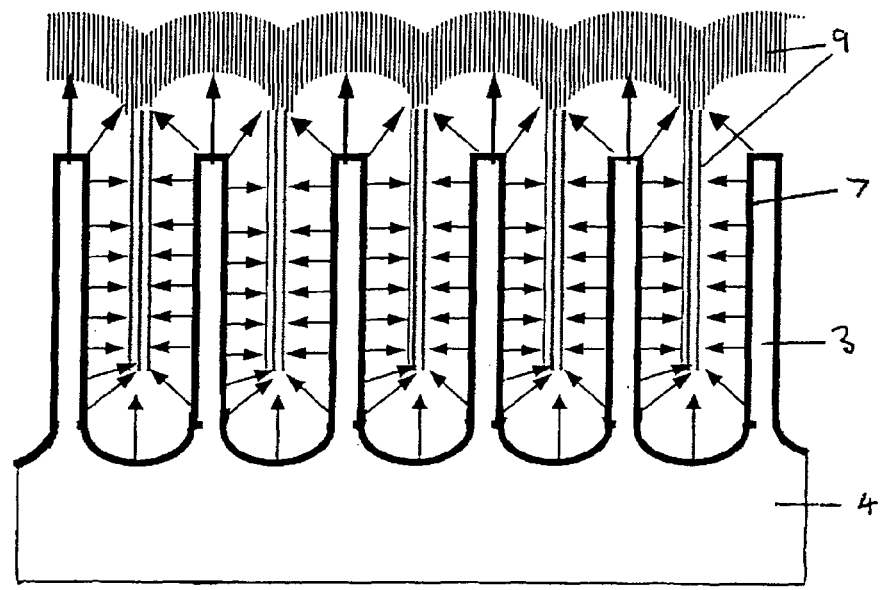
FIG. 8 corresponds to FIG. 7 but illustrates the electric field (indicated by arrows) expected due to the interdigitated structure of the solar cell.
Figure 9:
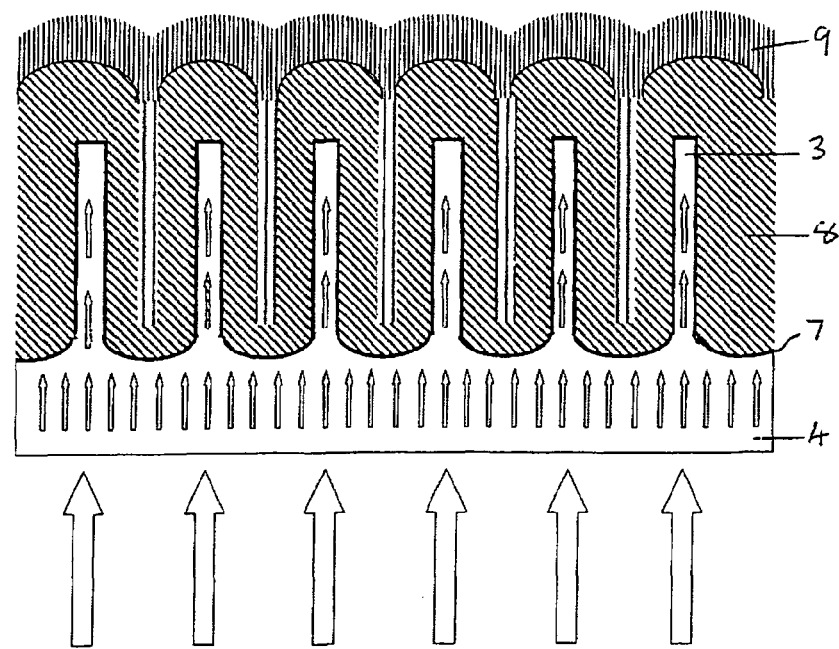
FIG. 9 corresponds to FIG. 7 but arrows indicate the path of the light in the solar cell, indicating the possible light trapping effects due to the vertical, nanoscale structures.

As indicated schematically in FIGS. 7, 8 and 9, growth of the thin film over the structures 3 may lead to the upper surface of the thin film being non-planar, that is having some surface roughness. The degree of surface roughness, which is defined to be the RMS (root mean square) of the surface displacement from their mean value, is related to the pitch of the structures 3, with a shorter pitch leading to greater surface roughness. In some structures such as photovoltaic devices, a degree of surface roughness may be desirable to optimise the light absorption properties of the device. In addition, if the structures 3 are transparent it is expected that light will be coupled more effectively into the film. In the present invention, both the width (parallel to the substrate) of the structures 3 and their pitch can be controlled independently of one another, and this control may be used to optimise the desired light-trapping properties of the device over a particular wavelength range in which it is intended the device will be operated.

The height of the structures 3 will be approximately equal to the desired thickness of the thin film. Typically, the structure height will be between 1 µm and 10 µm. The lateral width of the structures, or their smallest lateral width in the case of 2-D structures as shown in (c) of FIG. 7 will typically be less than 1 µm and is preferably less than 500 nm. A smaller lateral width of the structure will mean that there will be a lower proportion of the volume of the body occupied by the structures (where the "body" consists of the structures and the film deposited around the structures). In most cases, it is the film deposited around the structures, not the structure themselves, that is of interest—the structures serve only as templates to give an enhancement of thin film growth. Therefore it is generally desirable to maximise the amount of materials of the thin film that may be disposed in the space between the structures.

For growing a film having a thickness of approximately 2 µm (which, as noted above may contain a single layer or may contain two or more layers of different material composition/doping), an array of nanopillars having a height of 2 µm, a diameter of 50 nm, and a nanostructure pitch of 500 nm (where "pitch" refers to the distance between the centres of two nearest-neighbour structures) would be suitable. Use of nanostructures of these dimensions gives an increase in the deposition rate of a factor of approximately 10.

Moreover, a higher height/pitch ratio of the structures gives a greater enhancement of thin film growth (the final thin film thickness is determined by the height of the structures, while the deposition time is determined by the time required to fill the space between the structures, which depends on pitch). A higher pitch/lateral dimension ratio of the structures minimises the volume occupied by the structures and so maximises the amount of the thin film material that may be disposed in the space between the structures. Therefore, the height:pitch ratio of the structures is preferably at least 1:1, and is more preferably greater than 4:1, and the pitch:lateral dimension ratio of an elongate structure is preferably at least 2:1 and more preferably at least 4:1. (In the case of an elongate one-dimensional structure such as a nanowire, each lateral dimension preferably satisfies this pitch:lateral dimension ratio, whereas in the case of a 2-dimensional structure such as the planar structure shown in (c) of FIG. 7 only one lateral dimension will satisfy this ratio.)

Depending on the intended application of the invention, it may be preferable to deviate from these dimensions and ratios in order to improve the device performance, by compromising on the enhancement of the growth rate, for example to optimise light trapping where the invention is applied to a photovoltaic device.

The pitch of the structures 3 is preferably smaller than their height. Furthermore, the height h of the structures preferably satisfies:

$$xh \geq d$$

where d is the minimum thickness of the thin film required to fill the volume between the structures and x is the degree of conformality (as defined above) of the formation process. There will always be enhanced thin film growth on a non-planar substrate surface compared to growth on a planar surface. However, ensuring that this inequality is satisfied provides a growth rate enhanced by a factor of at least 2 compared to growth on a planar surface.

FIG. 13(a) illustrates the parameter d for the case of a square lattice. FIG. 13(a) is a schematic plan view of the substrate 4 showing the structures 3. Point A in FIG. 13(a) is equidistant from the external surface of three nearest structures, so that growing the thin film to have a thickness equal to $$d = \frac{\sqrt{2}}{2} p - r,$$

where p is the pitch of the structures and r is half the width of the structures in a direction parallel to the surface of the substrate will ensure that the thin film completely fills the volume between the structures.

Figure 13C:
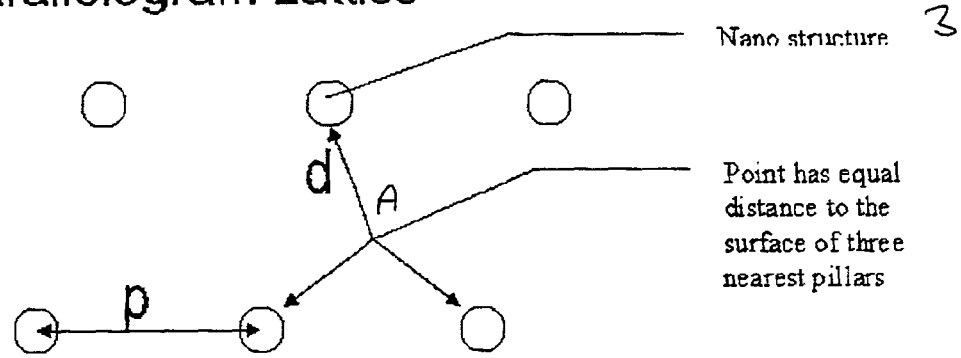
Figure 13D:
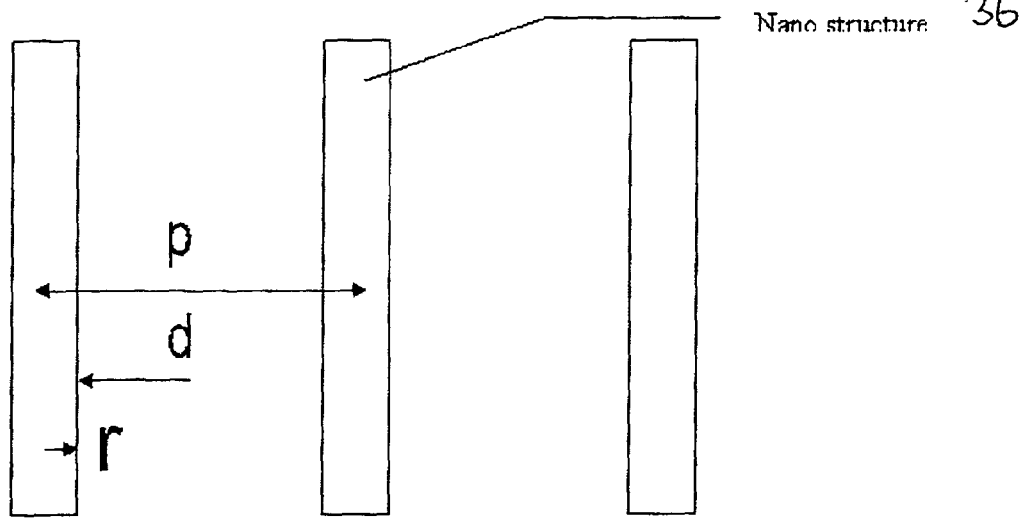

An equivalent point A can be found for alternative periodic structures. For example FIGS. 13(b) to 13(d) illustrate the parameter d of a triangular lattice (FIG. 13(b)), a parallelogram lattice (FIG. 13(c)) and planar structures (FIG. 13(d)). In FIGS. 13(b) and 13(c), the point A is equidistant from the external surface of three nearest structures 3, so that growing the film to have a thickness equal to the distance between point A and the external surface of one of the nearest structures will ensure that the thin film completely fills the volume between the structures. In the case of the planar structures of FIG. 13(d), growing the thin film to a thickness d=½(p−2r) will ensure that the thin film completely fills the volume between the structures 3b.

Figure 14:
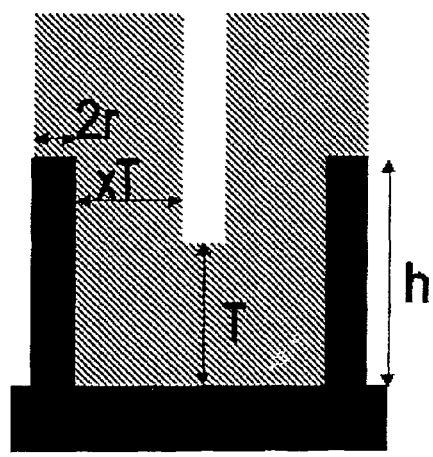
FIG. 14 is a schematic sectional view illustrating the formation of two sets of interlaced structures.

The method of the invention can be easily arranged to obtain an interlaced structure in which a finite volume around point A (as described above) is occupied by a different material. Also, the height h of the elongate structures 3 present on the substrate 4 needs to exceed the thickness T of the film deposited on a planar surface before the layer forming part of the top-electrode is conformably deposited. The thickness T is shown on FIG. 14, which is a schematic sectional view through the structure after growth of the thin-film. Hence, to benefit from the enhanced growth while obtaining two interlaced sets of structures (for example interlaced electrodes) the condition $$h \geq \frac{d}{x} > T$$

needs to be fulfilled.

Figure 12A:
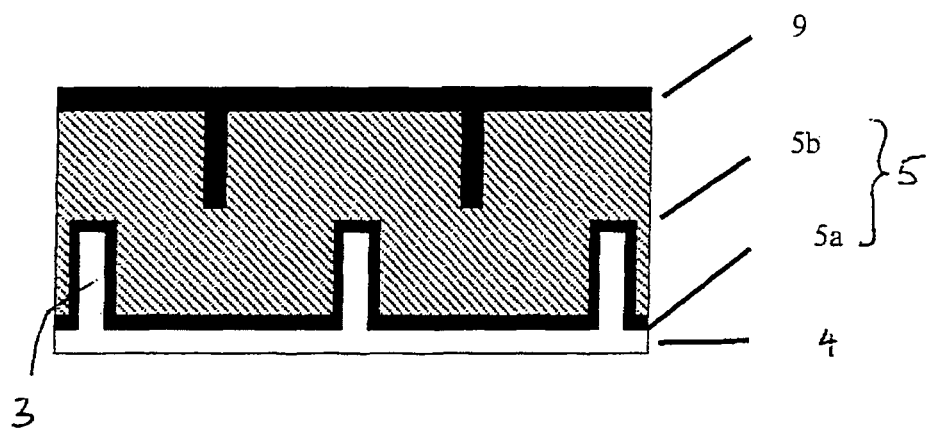
FIG. 12(a) illustrates a device structure obtained by use of inappropriately-dimensioned structures.

FIG. 12(a) is a schematic sectional view illustrating the effect of inappropriately-dimensioned structures. In FIG. 12(a) a thin film 5 including an electrode and one or more active device layers and composed, in this example, of a conformally-deposited electrode layer 5a and a conformally-deposited layer 5b, is grown over a surface of a substrate 4 provided with structures 3. A further layer 9 is then conformally-deposited, to form an upper electrode. However, the spacing between the structures 3 is so large, relative to their height and smallest dimension, that the layer 5 is so thick that the upper electrode 9 is not interlaced with the lower electrode layer 5a—the tips of the upper electrode structures are further from the substrate 4 than are the tips of the lower structure 3. If it is desired for the two electrodes to be interlaced, while taking advantage of a substantial increase in deposition rate, for example in the manner of FIG. 9, a closer spacing of the structures 3 on the substrate 4 would be required.

Figure 12B:
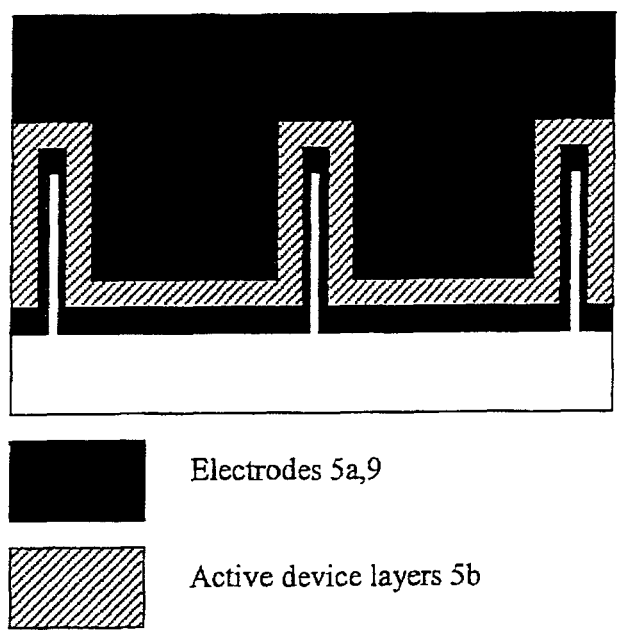
FIG. 12(b) illustrates another device structure obtained by use of the structures of FIG. 12(a)

However, it is important to note that an interlaced electrode structure can be still obtained with the widely spaced structures of FIG. 12(a), if the layer or layers separating the two electrodes are sufficiently thin [FIG. 12(b)].

In the case of a structure that is inclined with respect to the substrate surface, the height becomes the height of the structures projected onto the normal direction, and the spacing between structures becomes the spacing projected onto the normal of nano structures.

Figure 11:
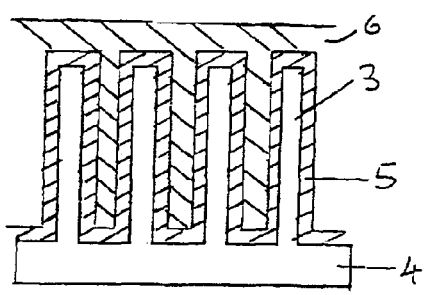
FIGS. 11(a) to 11(d) illustrate a further feature of the present invention.
Figure 11:
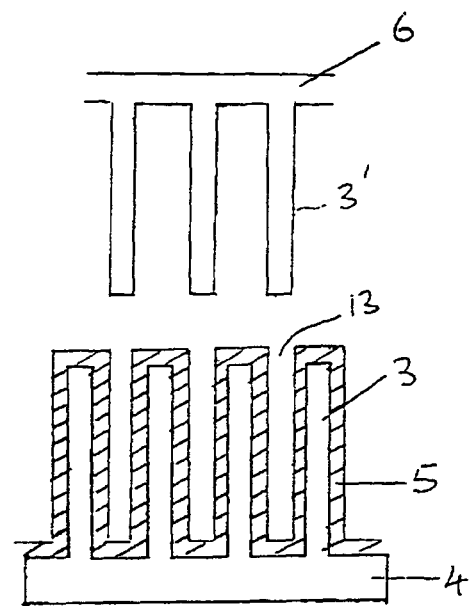
Figure 11:
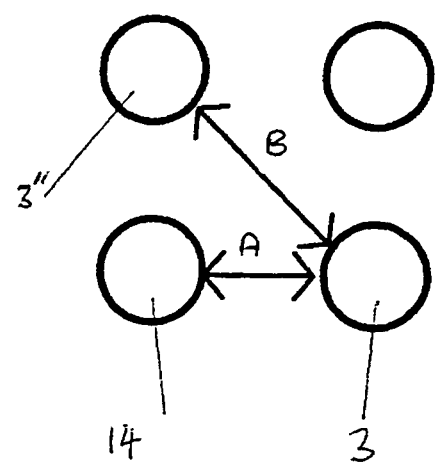
Figure 11D:
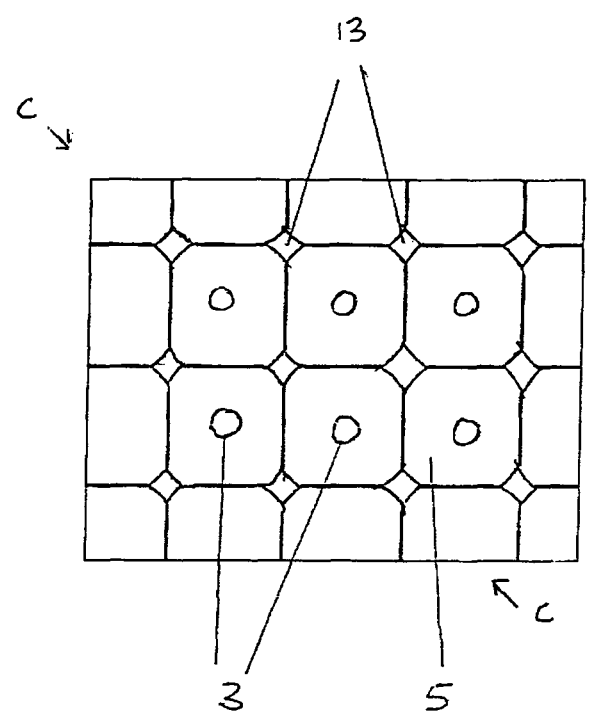

FIGS. 11(c) and 11(d) further illustrate the use of the invention to obtain an interlaced structure in which a finite volume around point A (as described above) is occupied by a different material. This is done by depositing the thin film 5 (comprising one or more layers conformally deposited over the surface and over the structures) such that the thickness of the conformal layer, or the sum of the thicknesses of the conformal layers, is less than half the spacing between two neighbouring ones of the structures so that the conformal layer(s) do not fill the volume between the neighbouring ones of the structures. This results in the presence of volumes 13 that are not occupied by the thin film 5, as shown in FIG. 11(d) which shows, in plan view, the result of deposition of the thin film 5 of the substrate. Each volume 13 extends into the plane of the paper in FIG. 11(d).

In order for the volumes 13 that are not occupied by the thin film 5 to be disconnected from one another, it is required that the thickness of the thin film (that is, the thickness of the conformal layer, or the sum of the thicknesses of the conformal layers) is greater than half the spacing between two nearest-neighbouring ones of the structures. The thickness must also be less than the minimum thickness d that is required to fill the volume between the structures, in order to ensure the existence of volumes 13 that are not occupied by the thin film 5.

FIG. 11(c) is a schematic plan view showing structures 3, 3" and 14 on the substrate. Considering the structure 3, this has three neighbouring structures shown in FIG. 11(c) and other neighbouring structures that are not shown in FIG. 11(c). The structure 3 and the structure 14 are "nearest neighbours", in that structure 14 is the closest neighbouring structure (or one of two or more equal closest neighbouring structures) to structure 3. (That is, there does not exist a structure whose spacing from structure 3 is less than A, where A is the spacing between structure 3 and structure 14.) Structure 3 and the structure 3" are neighbours but are not nearest neighbours, since the spacing B between structure 3 and structure 3" is greater than the spacing A between structure 3 and structure 14.

In order to obtain volumes that are not occupied by the thin film 5, the thickness of the thin film must be less than half the spacing between two neighbouring ones of the structures, for example must be less than half the spacing between structure 3 and structure 3" (ie the thickness of the film must be less than B/2). If the film thickness is greater than this, the volume between the structures will be completely occupied by the thin film and the volumes 13 in FIG. 11(d) that are not occupied by the thin film 5 cannot exist. However, for the volumes 13 in FIG. 11(d) to be disconnected from one another, the thickness of the thin film must be greater than half the spacing between two nearest-neighbouring ones of the structures, for example must be greater than half the spacing between structure 3 and structure 14" (ie the thickness of the film must be greater than A/2). If the thickness of the thin film is less than A/2, the volumes 13 will be connected to one another.

As is shown schematically in FIG. 11(a), when the disconnected, empty spaces 13 between each pair of diagonally adjacent structures 3 in FIG. 11(d) are filled with further material, this material takes on the shape of a further set 6 of structures 3'. FIG. 11(a) is a cross-section through the structure along the line C-C indicated in FIG. 11(d), through diagonally adjacent structures. This is shown more clearly in FIG. 11(b), in which the set 6 of further structures 3' is shown separated from the structures 3 and the thin film 5 for clarity.) The further material making up the set 6 of further structures 3' may include one or more layers of different material composition. For example, it may include an electrically conductive layer for forming an electrode layer. The or each layer of material deposited to form the further material is preferably a homogenous layer, in that its material composition and thickness are uniform or substantially uniform over the area of the layer.

The set 6 of structures 3' has similar features to the structures 3 on the substrate 4 such as similar aspect ratio, pitch, height, orientation and width, but extend in opposite directions. As shown in FIG. 9, for example, the structures 3' (which correspond to the elongate regions in the n-type silicon layer 9) are interdigitated or interlaced with the structures 3.

As explained above, the first set of structures 3 may be obtained by a subtractive process, which requires selective material removal from a wafer (for example using masking and etching steps). Producing the structure of FIG. 9 in this way has the advantage that the two sets of elongate structures 3, 3' can be produced solely by relying on well-controllable (conformal) deposition techniques without the need of costly lithographic pattern definition.

A further advantage is that, as the invention allows a device structure of FIG. 9 to be fabricated without the need for nanowire growth, there will be a much wider choice of material for forming the electrodes 7, 9 of the device structure of FIG. 9 as these may be formed of any conductive material that can be deposited by a substantially conformal deposition process. A yet further advantage is that, where the structures 3 are made of a transparent material (for example where the structures 3 and substrate 4 are formed by a subtractive process applied to a transparent wafer so that the structures 3 are integral with the substrate), the penetration of the transparent substrate into the cell offers an opportunity to trap light. In solar cells which incorporate conventional nanowires, such as that described in US2008/009401 for example, the boundary between the nanowires and the electrodes will cause light scattering and reflection, as the nanowires and electrodes are made of two different materials, effectively reducing the amount of light coupled into the active device region.

As can be seen from FIGS. 11(a) and 11(b), the height of the structures 3' of the second set is approximately equal to the height of the structures 3 of the first set.

As noted above, and as shown in FIGS. 7, 8 and 9, the upper surface of the thin film 5 may exhibit surface roughness. If desired, the upper surface may be planarised, for example by depositing a planarising layer over the upper surface of the thin film and/or polishing the upper surface using any suitable technique.

Figure 6:
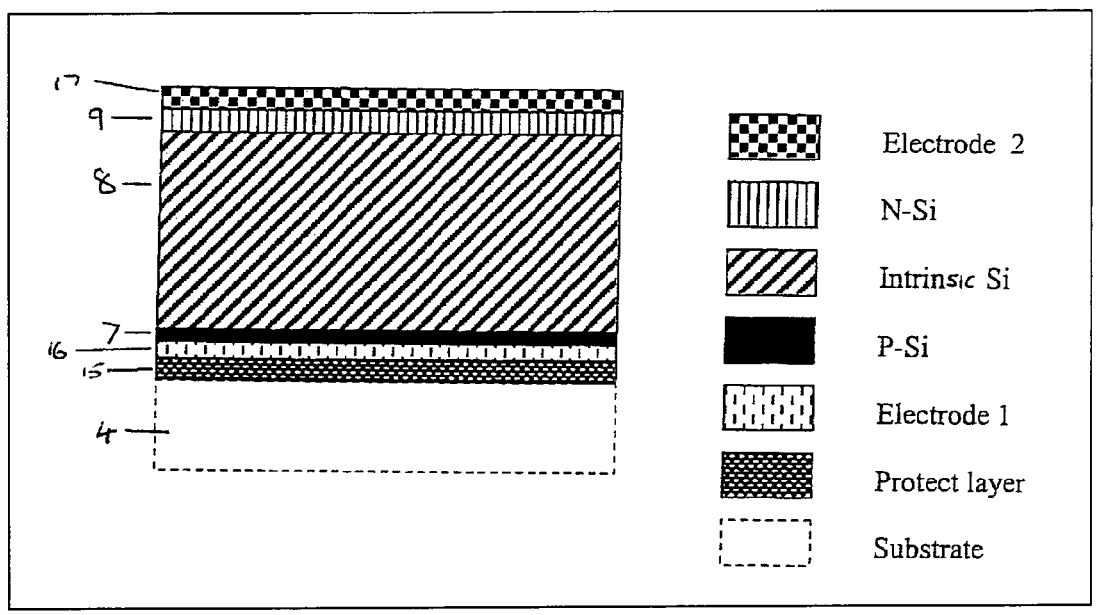
FIG. 6 shows a cross-section of the active layers of a typical thin film solar cell.

A further embodiment discloses how the methods described above can be used to form a photovoltaic device, for example a solar cell structure. The deposition can be carried out on any substrate but in this preferred embodiment the structures are on a transparent substrate. A method of making this solar cell structure is given below:

If desirable, the pillars can be thinned after their formation so that the volume taken up by the pillar in the final structure is reduced. This may be advantageous, as the pillars do not form part of the active volume (the heterojunction) of the solar cell. It may be desirable to deposit a protective layer (shown in FIG. 6 or 7, for example) onto the substrate 4 before the first conformal layer is deposited, to prevent diffusion from the substrate into the active area, and/or an antireflection coating. A dielectric layer, for example, may be deposited to act as a protective layer or an antireflection coating. Subsequently a first electrode may be formed followed by layers defining the active region of the solar cell and any other layers desirable for the structure of the photovoltaic cell (e.g. transparent conductors, protective oxide layers, etc.) are deposited. The active area can take various forms, which are different from the planar geometry of a regular thin film solar cell (FIG. 6). One such possible configuration is shown in FIG. 7. In the structure of FIG. 7, a protective layer 15 is provided over the substrate 4 and structures 3, and a first electrode layer 16 is provided over the protective layer 15. Layers 7, 8, 9 of, respectively p-silicon, intrinsic silicon and n-type silicon are disposed over the first electrode layer 16. A second electrode layer 17 is disposed over the n-type silicon layer 9.

In another preferred embodiment, shown in FIG. 8, the active area of the solar cell consists of a structure similar to the one shown in FIG. 7. The different layers 7, 8, 9 of the active region of the semiconductor are interlaced, so that the electric field is predominately parallel to the substrate plane 4a in FIG. 3(a) or FIG. 8, while the incident light direction is predominantly perpendicular to the surface 4a of the substrate 4. In comparison with a planar solar cell of similar thickness, an increase in electric field is achieved due to reduced electrode spacing.

An advantage of above configuration will be the decoupling between carrier diffusion distance and light absorbing depth. The substrate with regular nanostructures in the embodiment of FIG. 8 will provide a precise control of carrier diffusion distance and light absorbing depth. In contrast, in an ordinary planar cell, the carriers within the cell drift vertically to the top/bottom surfaces of the cell while the light is also absorbed vertically. The amount of light that will be absorbed in the cell is directly linked to its thickness which is limited by the carrier diffusion length. However, the configuration shown in FIG. 8 decouples the absorption from the extraction efficiency because most carriers will drift horizontally (ie, parallel to the plane of the substrate) instead of vertically due to a large proportion of the built-in field being aligned parallel to the substrate plane. The expected increase in efficiency could provide an attractive alternative to multijunction solar cells.

Another envisaged advantage of the invention lies in the wave-guiding and/or antireflection properties of the structures 3.

According to the publications in Nanotechnology 11 (2000) 161-164 and Proc. R. Soc. B (2006) 273, 661-667, a sub-wavelength nanostructure array will significantly reduce the light reflection utilising a gradient in the effective refractive index. On the other hand if the feature sizes exceed the wavelengths of the incoming light, geometrical optics can be applied to enhance light trapping. Therefore we expect that the reflective properties are affected by the dimensions of the nanostructures providing sufficient scope to optimise the efficiency with which light is coupled into the device.

Another embodiment of the invention relates to the formation of microlenses on the front side of the substrate, whereby the front side is the substrate side that receives light. The aim of forming these microlenses is to concentrate the light to desired regions of the solar cell on the backside of the substrate on which the solar cell structure will be deposited (this side will be referred to as the backside).

Figure 10:
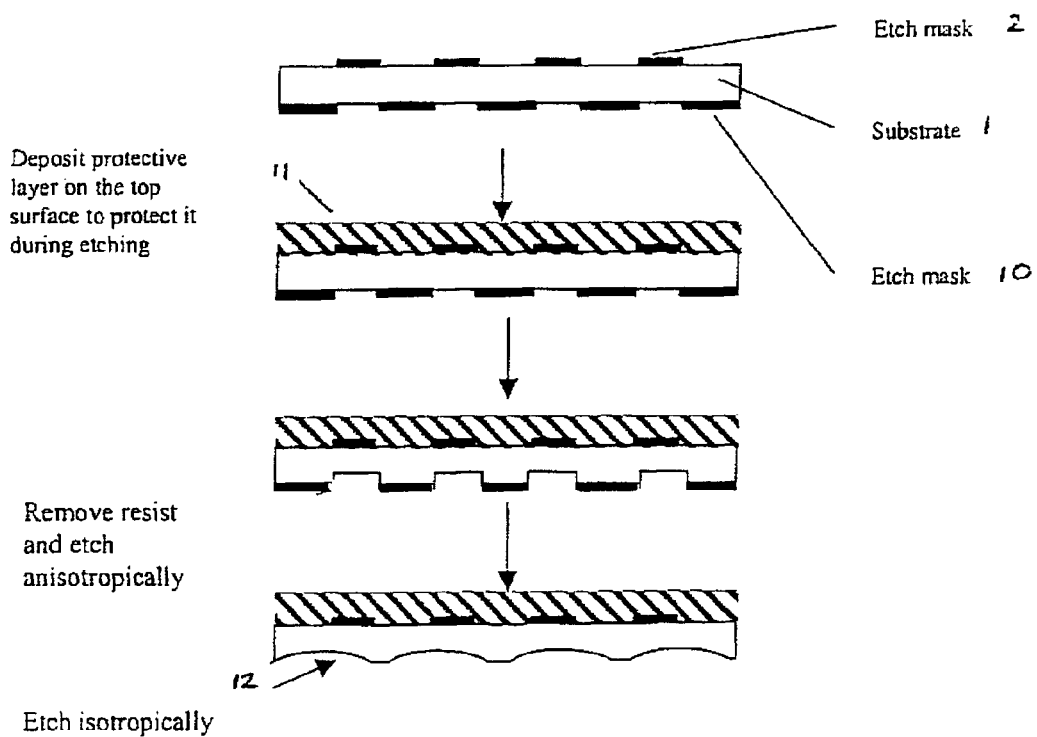
FIG. 10 shows one possible process flow of how to create microlenses which focus the light into certain desirable regions of the solar cell.

In another embodiment, the microlenses are created using a transparent substrate which is patterned on both front and back sides as shown in FIG. 10. Etch masks 2 are placed on the back side of the substrate so that pillars or other structures can be etched. Etch masks 10 are also placed on the front side of the substrate 4 to allow the substrate to be etched to form lenses. However, the etch masks can be laterally displaced relative to each other so that the resulting microlenses can be focused on any desirable region of the solar cell. A preferred method to create the microlenses is outlined below and shown in FIG. 10:

STEP 1: Form etch masks 2, 10 on both front side and back side of substrate 1 as shown in FIG. 10.

STEP 2: Deposit a protective layer 11 on the back side where nanostructures are to be formed.

STEP 3: Anisotropically remove material from the front side of the substrate on which the protective layer 11 is not provided, from areas of the wafer 1 not covered by the etch mask 10.

STEP 4: After removal of the etch mask 10 from the front side of the substrate, use an isotropic etch to form the microlenses.

In a modified version of this embodiment, anti-reflection structures may be formed on the front side of the substrate in addition to or instead of microlenses.

Structures 3 may then be formed on back side of the substrate 1. For example, the protective layer 11 may be removed, and material may be removed from the substrate 1 in regions where the etch mask 2 is not provided on the back side of the substrate 1.

One or more layers may then be deposited by a conformal deposition process over the structures formed on the back side of the substrate 1, as described herein above.

If desired, a further protective layer (not shown) may be deposited over the microlenses 12 during the steps of forming the structures on the back side of the substrate 1 and conformally depositing one or more layers.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

The invention claimed is:

1. A method of growing a thin film, the method comprising:
growing a thin film by conformally forming at least one layer over a substrate having structures extending from a surface of the substrate, whereby the or each conformal layer is formed over the surface of the substrate and over the structures extending from the surface;
wherein the thickness of the conformal layer from an inner surface to an outer surface of the conformal layer, or the sum of the thicknesses of the conformal layers, is at least half the average spacing of the structures;
and wherein at least one of the length of the structures, the average spacing of the structures and the size of the smallest dimension of the structures is set so as to provide an enhanced growth rate for the or each conformal layer, wherein the enhanced growth rate is a growth rate that is at least twice the growth rate that would be obtained on a planar growth surface, using the same growth method and the same growth conditions.

2. A method as claimed in claim 1 wherein the average spacing, in a direction parallel to the substrate, between the structures is less than the length of the structures.

3. A method as claimed in claim 1 wherein the structures have a uniform or substantially uniform pitch.

4. A method as claimed in claim 1 wherein the structures have a uniform or substantially uniform length.

5. A method as claimed in claim 1 wherein the structures are identical or substantially identical to one another.

6. A method as claimed in claim 1 wherein the length h of the structures satisfies:

$$xh \geq d$$

where d is the minimum thickness of the thin film required to fill the volume between the structures, and x is the degree of conformality of the formation of the at least one layer.

7. A method as claimed in claim 1 wherein the structures are elongate one-dimensional structures.

8. A method as claimed in claim 7 wherein the cross-section of the structures is approximately circular, whereby r is half the diameter of the structures.

9. A method as claimed in claim 7 wherein the structures are nanowires or nanorods.

10. A method as claimed in claim 1 wherein the structures are planar structures.

11. A method as claimed in claim 1 wherein the structures make an angle of 45° or less to the normal of a plane of the substrate.

12. A method as claimed in claim 11 wherein the structures make an angle of 20° or less to the normal of a plane of the substrate.

13. A method as claimed in claim 11 wherein the structures make an angle of 5° or less to the normal of a plane of the substrate.

14. A method as claimed in claim 1 and comprising forming the structures.

15. A method as claimed in claim 14 and comprising forming the structures by a subtractive process.

16. A method as claimed in claim 1 and comprising forming at least two conformal layers over the surface and over the structures.

17. A method as claimed in claim 1 and further comprising planarising the upper surface of the thin film.

18. A method as claimed in claim 1 and further comprising exposing one or more of the structures after growth of the thin film.

19. A method as claimed in claim 18 and further comprising removing one or more of the structures.

20. A method as claimed in claim 19 and further comprising disposing one or more materials having different material composition to the structures in the volume left by removal of the one or more structures.

21. A method as claimed in claim 1 and further comprising forming another layer over the upper surface of the thin film.

22. A method as claimed in claim 1 wherein the conformal layer(s) constitute the active region of a device.

23. A method as claimed in claim 1 wherein the conformal layer or at least one conformal layer comprises a conductor or a semiconductor.

24. A method as claimed in claim 23 wherein the conformal layer or at least one conformal layer comprises at least one of the group consisting of Si, Ge, III-V semiconductors, II-VI semiconductors and C.

25. A method as claimed in claim 24 wherein the thin film further comprises a conductive layer.

26. A method as claimed in claim 24 wherein the thin film comprises at least two conductive layers sandwiching at least one semiconductive layer.

27. A method as claimed in claim 1 and further comprising depositing a layer of a dielectric material.

28. A method as claimed in claim 27 wherein the dielectric layer, in use, acts as an anti-reflective coating.

29. A method as claimed in claim 27 wherein the dielectric layer, in use, acts as a diffusion barrier.

30. A method as claimed in claim 16 and comprising forming at least two conformal layers having different doping types from one another over the surface and over the structures.

31. A method of forming a structure, the method comprising:
growing a thin film by conformally forming at least one layer over a substrate having a first set of structures extending from a surface of the substrate, whereby the or each conformal layer is formed over the surface of the substrate and over the first set of structures extending from the surface;
wherein the thickness of the conformal layer from an inner surface to an outer surface of the conformal layer, or the sum of the thicknesses of the conformal layers, is less than a minimum thickness d of the thin film that is required to completely fill in the volume between structures of the first set of structures whereby the conformal layer(s) do not fill the volume between the neighbouring ones of the structures;
and wherein the method further comprises depositing one of more further layers in the volume unoccupied by the conformal layer(s) thereby to obtain a second set of structures interlaced with the first set of structures and the second set of structures comprises a conductive layer for forming an electrode layer.

32. A method as claimed in claim 31 wherein the length h of the structures of the first set of structures satisfies:

$$h \geq \frac{d}{x} > T$$

where d is the minimum thickness of the thin film required to fill the volume between the structures, x is the degree of conformality of the formation of the at least one layer, and T is the thickness of the deposited film.

33. A thin film formed by a method as defined in claim 1.

34. A device comprising a thin film formed by a method as defined in claim 1.

35. A structure formed by a method as defined in claim 31.

36. A device comprising: a substrate; an array of structures extending from a surface of the substrate; and a thin film comprising one or more layers conformally deposited over the surface and over the structures; wherein the length h of the structures satisfies:

$$xh \geq d$$

where d is the minimum thickness of the thin film required to fill the volume between the structures, and x is the degree of conformality of the formation process.

37. A device comprising:
a substrate; an array of structures extending from a surface of the substrate;
a thin film comprising one or more layers conformally deposited over the surface and over the structures, wherein the thickness of the conformal layer from an inner surface to an outer surface of the conformal layer, or the sum of the thicknesses of the conformal layers, is less than half the spacing between two neighbouring ones of the structures whereby the conformal layer(s) do not fill the volume between the neighbouring ones of the structures; and
one or more further layers deposited in the volume unoccupied by the conformal layer(s) so as to provide a second array of structures interlaced with the first set of structures and the second array of structures comprises a conductive layer for forming an electrode layer.

38. A device as claimed in claim 37 wherein the thickness of the conformal layer, or the sum of the thicknesses of the conformal layers, is greater than half the spacing between two nearest-neighbouring ones of the structures and is less than the minimum thickness d that is required to fill the volume between the structures.

39. A device as claimed in claim 36 wherein the structures of the array or of at least one of the arrays have a uniform or substantially uniform pitch.

40. A device as claimed in claim 36 wherein the structures of the array or of at least one of the arrays have a uniform or substantially uniform length.

41. A device as claimed in claim 36 wherein the structures of the array or of at least one of the arrays are identical or substantially identical to one another.

42. A device as claimed in claim 36 wherein the structures of the array or of at least one of the arrays are spaced so that their pitch is smaller than the length of the structures.

43. A device as claimed in claim 36 wherein the structures of the array or of at least one of the arrays are elongate one-dimensional structures.

44. A device as claimed in claim 43 wherein the structures of the array or of at least one of the arrays are nanowires or nanorods.

45. A device as claimed in claim 36 wherein the structures of the array or of at least one of the arrays are planar structures.

46. A device as claimed in claim 36 wherein the structures of the array or of at least one of the arrays are not electrically conductive.

47. A device as claimed in claim 36 and comprising an array of lenses or anti-reflection structures defined on another surface of the substrate.

48. A device as claimed in claim 36 wherein the structures of the array or of at least one the arrays comprise a transparent material.

49. A device as claimed in claim 36 wherein the structures of the array are integral with the body of the substrate.

50. A device as claimed in claim 36 wherein the thin film comprises a first electrode layer.

51. A device as claimed in claim 37 wherein the one or more further layers comprises a second electrode layer.

52. A device as claimed in claim 36 and comprising a photovoltaic device.

53. A thin film formed by a method as defined in claim 31.

54. A device comprising a thin film formed by a method as defined in claim 31.

55. A device as claimed in claim 37 wherein the structures of the array or of at least one of the arrays have a uniform or substantially uniform pitch.

56. A device as claimed in claim 37 wherein the structures of the array or of at least one of the arrays have a uniform or substantially uniform length.

57. A device as claimed in claim 37 wherein the structures of the array or of at least one of the arrays are identical or substantially identical to one another.

58. A device as claimed in claim 37 wherein the structures of the array or of at least one of the arrays are spaced so that their pitch is smaller than the length of the structures.

59. A device as claimed in claim 37 wherein the structures of the array or of at least one of the arrays are elongate one-dimensional structures.

60. A device as claimed in claim 37 wherein the structures of the array or of at least one of the arrays are planar structures.

61. A device as claimed in claim 37 wherein the structures of the array or of at least one of the arrays are not electrically conductive.

62. A device as claimed in claim 37 and comprising an array of lenses or anti-reflection structures defined on another surface of the substrate.

63. A device as claimed in claim 37 wherein the structures of the array or of at least one the arrays comprise a transparent material.

64. A device as claimed in claim 37 wherein the structures of the array are integral with the body of the substrate.

65. A device as claimed in claim 37 wherein the thin film comprises a first electrode layer.

66. A device as claimed in claim 37 and comprising a photovoltaic device.

* * * * *

UNITED STATES PATENT AND TRADEMARK OFFICE
CERTIFICATE OF CORRECTION

| | |
|---|---|
| PATENT NO. | : 8,778,781 B2 |
| APPLICATION NO. | : 13/054975 |
| DATED | : July 15, 2014 |
| INVENTOR(S) | : Christian Lang et al. |

It is certified that error appears in the above-identified patent and that said Letters Patent is hereby corrected as shown below:

Title Page, item (30), Foreign Application Priority Data,
"Jul. 24, 2008 (GB)     0813565.3," should be
-- Jul. 24, 2008 (GB)     0813568.3 --.

Signed and Sealed this
Ninth Day of December, 2014

Michelle K. Lee
*Deputy Director of the United States Patent and Trademark Office*